United States Patent
Dhindsa et al.

(10) Patent No.: US 8,216,486 B2
(45) Date of Patent: Jul. 10, 2012

(54) TEMPERATURE CONTROL MODULE USING GAS PRESSURE TO CONTROL THERMAL CONDUCTANCE BETWEEN LIQUID COOLANT AND COMPONENT BODY

(75) Inventors: Rajinder Dhindsa, San Jose, CA (US);
Henry Povolny, Newark, CA (US);
Jerry K. Antolik, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/304,893

(22) Filed: Nov. 28, 2011

(65) Prior Publication Data

US 2012/0070914 A1 Mar. 22, 2012

Related U.S. Application Data

(62) Division of application No. 12/289,657, filed on Oct. 31, 2008, now Pat. No. 8,083,855.

(60) Provisional application No. 61/001,112, filed on Oct. 31, 2007.

(51) Int. Cl.
| C23C 16/00 | (2006.01) |
|---|---|
| C23C 16/455 | (2006.01) |
| C23C 16/458 | (2006.01) |
| C23C 16/46 | (2006.01) |
| C23C 16/50 | (2006.01) |
| H01L 21/3065 | (2006.01) |

(52) U.S. Cl. ....... 216/67; 118/725; 118/723 E; 118/715; 118/724; 118/728; 156/345.27; 156/345.34; 156/345.47; 156/345.52; 156/345.53; 216/63; 427/509; 427/545; 427/569; 427/585; 427/592; 427/248.1; 438/689; 438/758

(58) Field of Classification Search ............. 118/724, 118/725, 723 E, 715, 728; 156/345.27, 345.34, 156/345.43, 345.47, 345.52, 345.53; 216/63, 216/67; 427/509, 545, 569, 585, 592; 438/689, 438/758
See application file for complete search history.

(56) References Cited

U.S. PATENT DOCUMENTS

| 2,440,245 | A | * | 4/1948 | Chevigny | 165/80.4 |
|---|---|---|---|---|---|
| 3,189,524 | A | * | 6/1965 | Hocker et al. | 376/423 |
| 5,228,513 | A | | 7/1993 | Hemsath | |
| 5,248,657 | A | | 9/1993 | Bailey et al. | |
| 5,294,778 | A | | 3/1994 | Carman et al. | |
| 5,295,822 | A | | 3/1994 | Hemsath | |
| 5,892,207 | A | | 4/1999 | Kawamura et al. | |
| 5,900,162 | A | | 5/1999 | Kawahara et al. | |
| 6,080,970 | A | | 6/2000 | Yoshida et al. | |
| 6,147,334 | A | | 11/2000 | Hannigan | |
| 6,490,146 | B2 | | 12/2002 | Wang et al. | |
| 6,508,884 | B2 | | 1/2003 | Kuibira et al. | |
| 6,508,885 | B1 | | 1/2003 | Moslehi et al. | |
| 6,610,170 | B2 | | 8/2003 | Tamura et al. | |
| 6,730,175 | B2 | | 5/2004 | Yudovsky et al. | |

(Continued)

*Primary Examiner* — Jeffrie R Lund
(74) *Attorney, Agent, or Firm* — Buchanan Ingersoll & Rooney PC

(57) ABSTRACT

A temperature control module for a semiconductor processing chamber comprises a thermally conductive component body, one or more channels in the component body and one or more tubes concentric therewith, such that gas filled spaces surround the tubes. By flowing a heat transfer liquid in the tubes and adjusting the gas pressure in the spaces, localized temperature of the component body can be precisely controlled. One or more heating elements can be arranged in each zone and a heat transfer liquid can be passed through the tubes to effect heating or cooling of each zone by activating the heating elements and/or varying pressure of the gas in the spaces.

17 Claims, 10 Drawing Sheets

U.S. PATENT DOCUMENTS

| | | |
|---|---|---|
| 6,847,014 B1 | 1/2005 | Benjamin et al. |
| 7,156,951 B1 | 1/2007 | Gao et al. |
| 7,161,121 B1 | 1/2007 | Steger |
| 7,554,059 B2 | 6/2009 | Awazu et al. |
| 7,645,341 B2 | 1/2010 | Kennedy et al. |
| 7,712,434 B2 | 5/2010 | Dhindsa et al. |
| 7,718,932 B2 | 5/2010 | Steger |
| 7,771,564 B2 | 8/2010 | Yokogawa et al. |
| 7,993,460 B2 | 8/2011 | Steger |
| 8,012,304 B2 | 9/2011 | Brillhart et al. |
| 8,034,180 B2 * | 10/2011 | Brillhart et al. ............... 118/724 |
| 8,038,796 B2 | 10/2011 | Ricci et al. |
| 8,083,855 B2 * | 12/2011 | Dhindsa et al. ............... 118/724 |
| 2002/0002951 A1 | 1/2002 | Kuznetsov |
| 2004/0187787 A1 | 9/2004 | Dawson et al. |
| 2005/0211385 A1 | 9/2005 | Benjamin et al. |
| 2008/0023147 A1 * | 1/2008 | Yokogawa et al. ....... 156/345.53 |
| 2009/0111276 A1 | 4/2009 | Dhindsa et al. |
| 2010/0078151 A1 | 4/2010 | Koenigsberg et al. |
| 2010/0122774 A1 | 5/2010 | Makabe et al. |
| 2010/0210115 A1 | 8/2010 | Hara et al. |
| 2012/0070914 A1 * | 3/2012 | Dhindsa et al. ................... 438/5 |

* cited by examiner

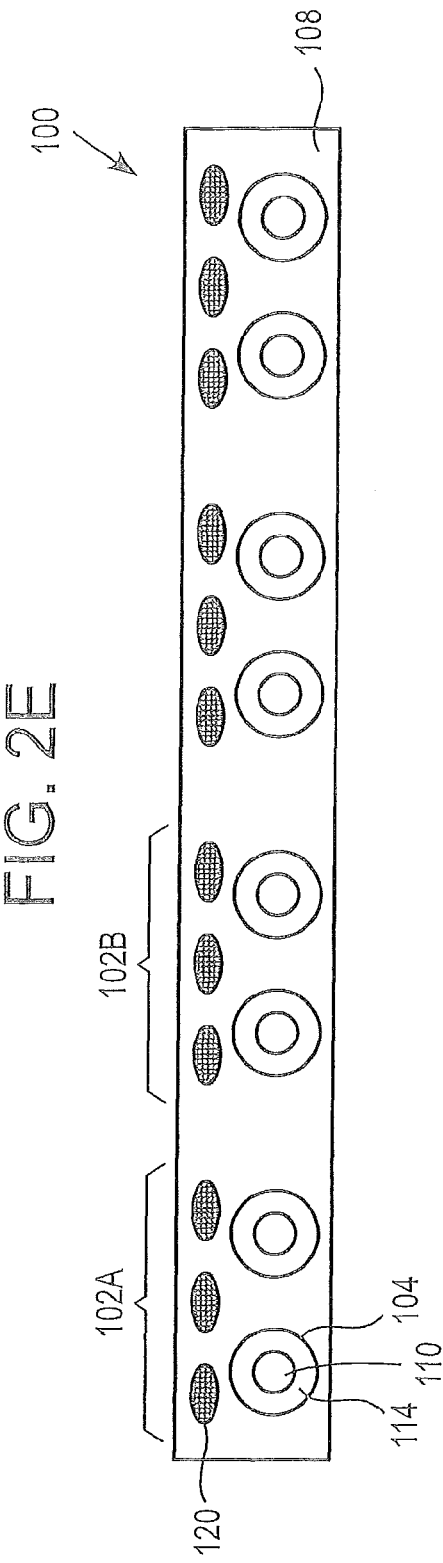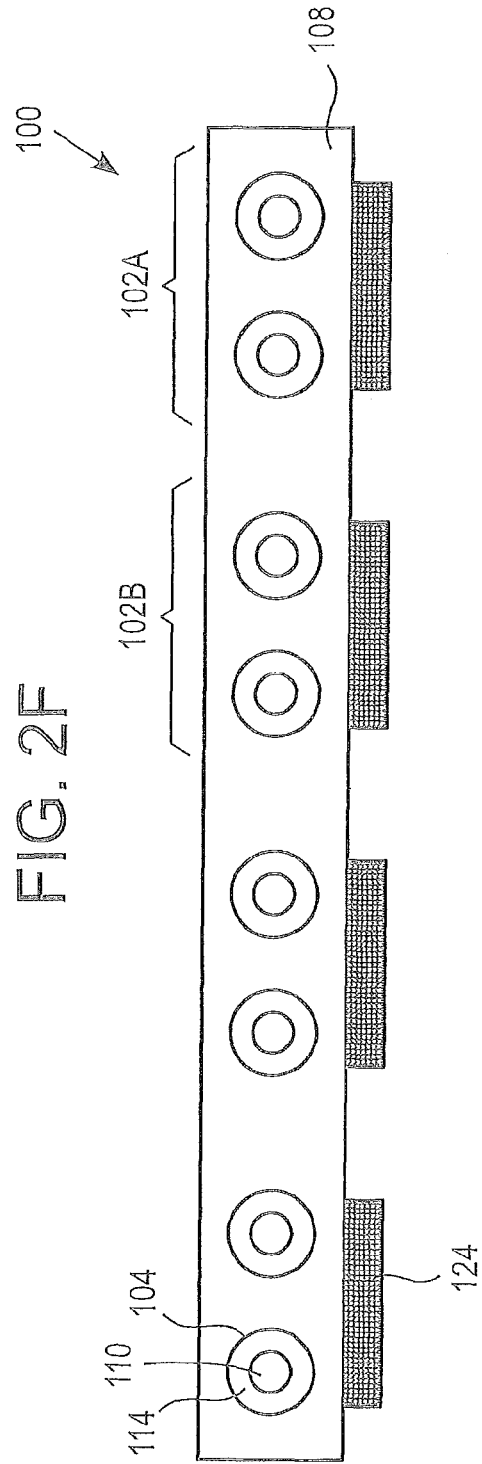

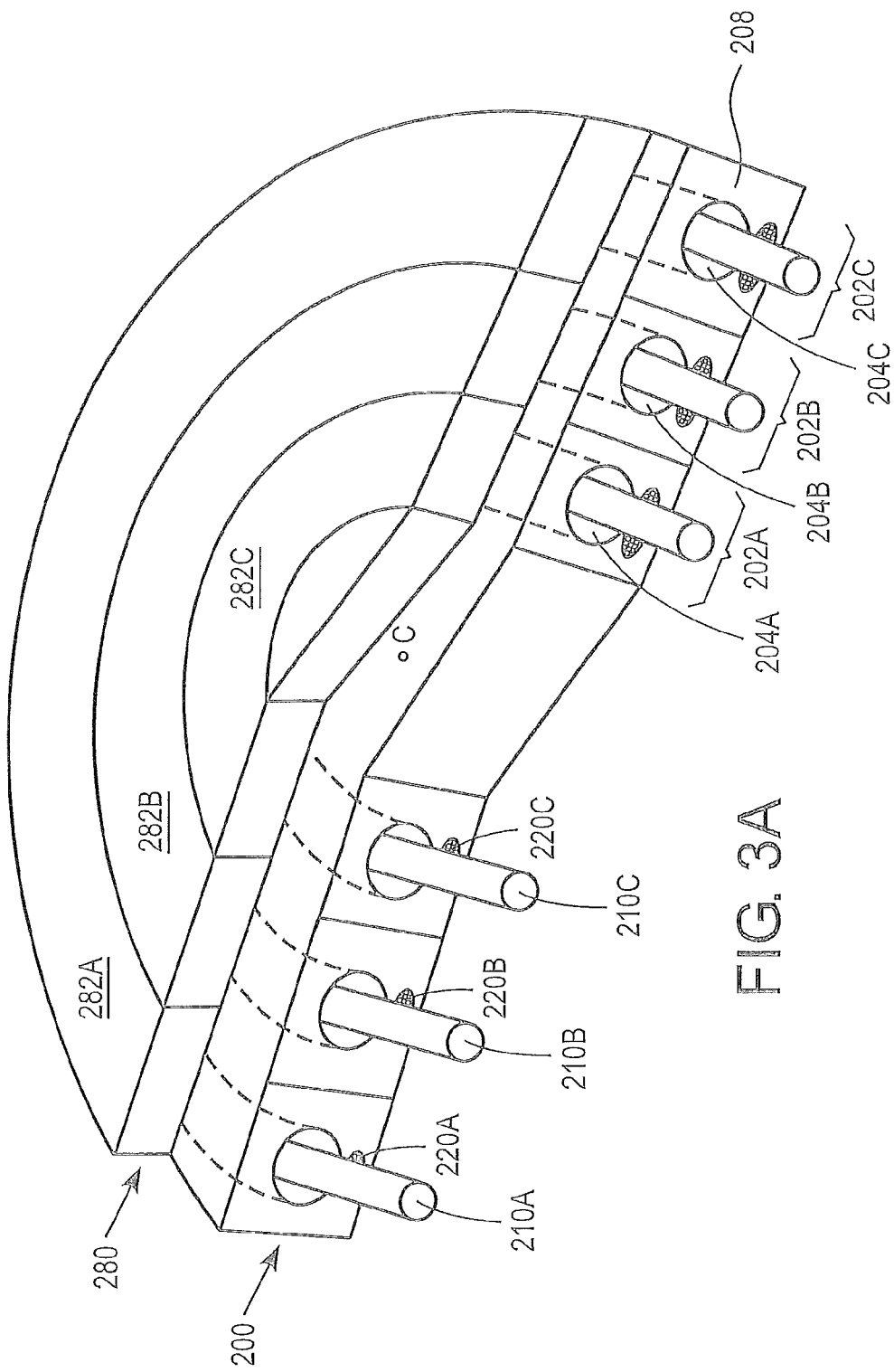

TEMPERATURE CONTROL MODULE USING GAS PRESSURE TO CONTROL THERMAL CONDUCTANCE BETWEEN LIQUID COOLANT AND COMPONENT BODY

CROSS-REFERENCE TO RELATED APPLICATIONS

This application is a divisional application of U.S. application Ser. No. 12/289,657 entitled TEMPERATURE CONTROL MODULE USING GAS PRESSURE TO CONTROL THERMAL CONDUCTANCE BETWEEN LIQUID COOLANT AND COMPONENT BODY, filed on Oct. 31, 2008 now U.S. Pat. No. 8,083,855, which claims priority under 35 U.S.C. 119(e) to U.S. Provisional Application No. 61/001,112 entitled TEMPERATURE CONTROL MODULE USING GAS PRESSURE TO CONTROL THERMAL CONDUCTANCE BETWEEN LIQUID COOLANT AND COMPONENT BODY and filed on Oct. 31, 2007, the entire content of each is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing top and bottom electrodes. An electric field is established between the electrodes to excite a process gas into the plasma state to process substrates in the reaction chamber. Due to shrinking feature sizes and the implementation of new materials, improvement in plasma processing apparatuses to control the conditions of the plasma processing is required.

SUMMARY

A temperature control module for a semiconductor processing chamber comprises a thermally conductive component body, one or more channels in the component body and one or more tubes with each tube concentric with a respective channel. A space between an exterior surface of each tube and an interior surface of each channel is adapted to contain a volume of pressurized gas. A liquid source is connected to the tubes and operable to flow liquid through the tubes. A gas source and a vacuum pump are connected to the spaces. The gas source is operable to increase a static gas pressure in each space in response to a controller and the vacuum pump is operable to evacuate each space in response to the controller. A temperature sensor is adapted to measure temperature of a plasma processing component in thermal communication with the thermally conductive component body and supply information to the controller.

BRIEF DESCRIPTION OF FIGURES

FIGS. 2A-2F illustrate multiple embodiments of the thermal control module.

FIGS. 3A-3B illustrate an embodiment of the thermal control module attached to a plasma processing component.

DETAILED DESCRIPTION

In processing semiconductor substrates, control over plasma parameters, such as plasma chemistry, ion energy, density, and distribution, electron temperature, etc., is desired to alter plasma processing results. In addition to these plasma parameter controls, temperatures of surfaces in a plasma chamber which confine the plasma may also be used to control plasma chemistry and hence, the processing results of a semiconductor substrate such as a wafer.

Figure 1:
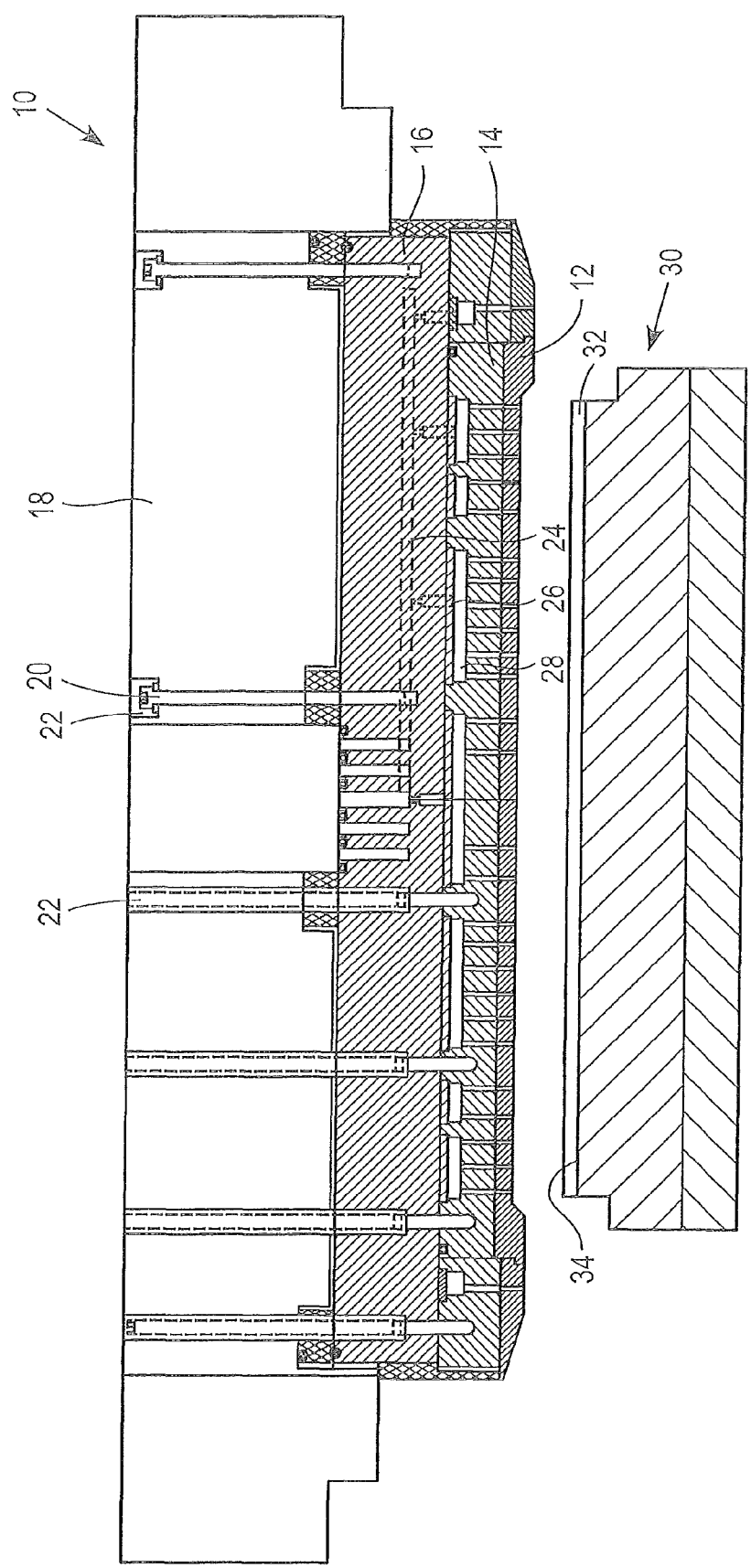
FIG. 1 is a cross-sectional view of an exemplary embodiment of a plasma processing apparatus.

FIG. 1 illustrates an exemplary embodiment of a showerhead electrode assembly 10 for a plasma processing apparatus in which semiconductor substrates, e.g., silicon wafers, are processed. The showerhead electrode assembly 10 includes a showerhead electrode including a top electrode 12, a backing member 14 secured to the top electrode 12, and a thermal control plate 16.

Thermal control plate 16 can be attached to top plate 18 with suitable fasteners 20 (e.g., threaded bolts, screws or the like) through aperture 22, which extends through top plate 18 and into thermal control plate 16. The thermal control plate 16 is preferably made of a metallic material, such as aluminum, an aluminum alloy, or the like. Thermal control plate 16 can contain radially extending gas distribution channels 24 and axially extending passages 26 to distribute process gases to plenums 28 between the backing member 14 and the thermal control plate 16.

A substrate support 30 including a bottom electrode and optional electrostatic clamping electrode is positioned beneath the top electrode 12 in the vacuum processing chamber of the plasma processing apparatus. A substrate 32 subjected to plasma processing is mechanically or electrostatically clamped on a top support surface 34 of the substrate support 30. Control of temperatures of the showerhead electrode 12 and substrate support 30 can be effected by incorporating a temperature control module therein.

The temperature of a showerhead electrode assembly 10 used in a plasma etch process can vary widely from the start of plasma processing to the end, from about 50° C. and about 400° C. When etching a series of wafers in a single wafer plasma etch chamber, it has been observed that temperatures of various portions of a radio frequency (RF) powered showerhead electrode vary over time and a central portion of the showerhead electrode can become more heated than edge portions due to heat generated by the RF powered showerhead electrode. For example, the temperature difference between the center and the edge of the showerhead electrode can be up to about 100° C. This variation in temperature is more pronounced when the electrode is run at higher power levels (e.g., 3,000 to 6,000 Watts) and can lead to non-uniformity in plasma etching. Thus, decreasing temperature variation of the RF powered showerhead electrode can provide more uniform plasma etching of wafers during a production run.

Likewise, during etching of substrate 32, the reactive ions of the plasma gas chemically react with portions of material on a face of the semiconductor wafer, resulting in temperature differences of up to 50° C. between the center and edge of the substrate. Local wafer temperature and rate of chemical reaction at each point on the wafer are interrelated such that non-uniform etching of material over a face of the wafer can result if the temperature of the wafer across its face varies too much. Thus, a need exists for a substrate support 30 with the ability to maintain a uniform substrate temperature.

In light of the temperature variation across plasma processing components (e.g., showerhead electrode assembly 10 or substrate support 30) which can result from the heat generated during use, the temperature control module described herein can provide improved processing results by maintaining the center and edge portion of the component within a desired temperature range. Preferably, the temperature variation of the component from center to edge is less than 100° C. (e.g., <75° C., <50° C., <25° C., <10° C. or <5° C.). The temperature control module preferably includes independently controllable heating/cooling zones for minimizing temperature variation across the showerhead electrode assembly 10 or substrate support 30.

Figure 2A:
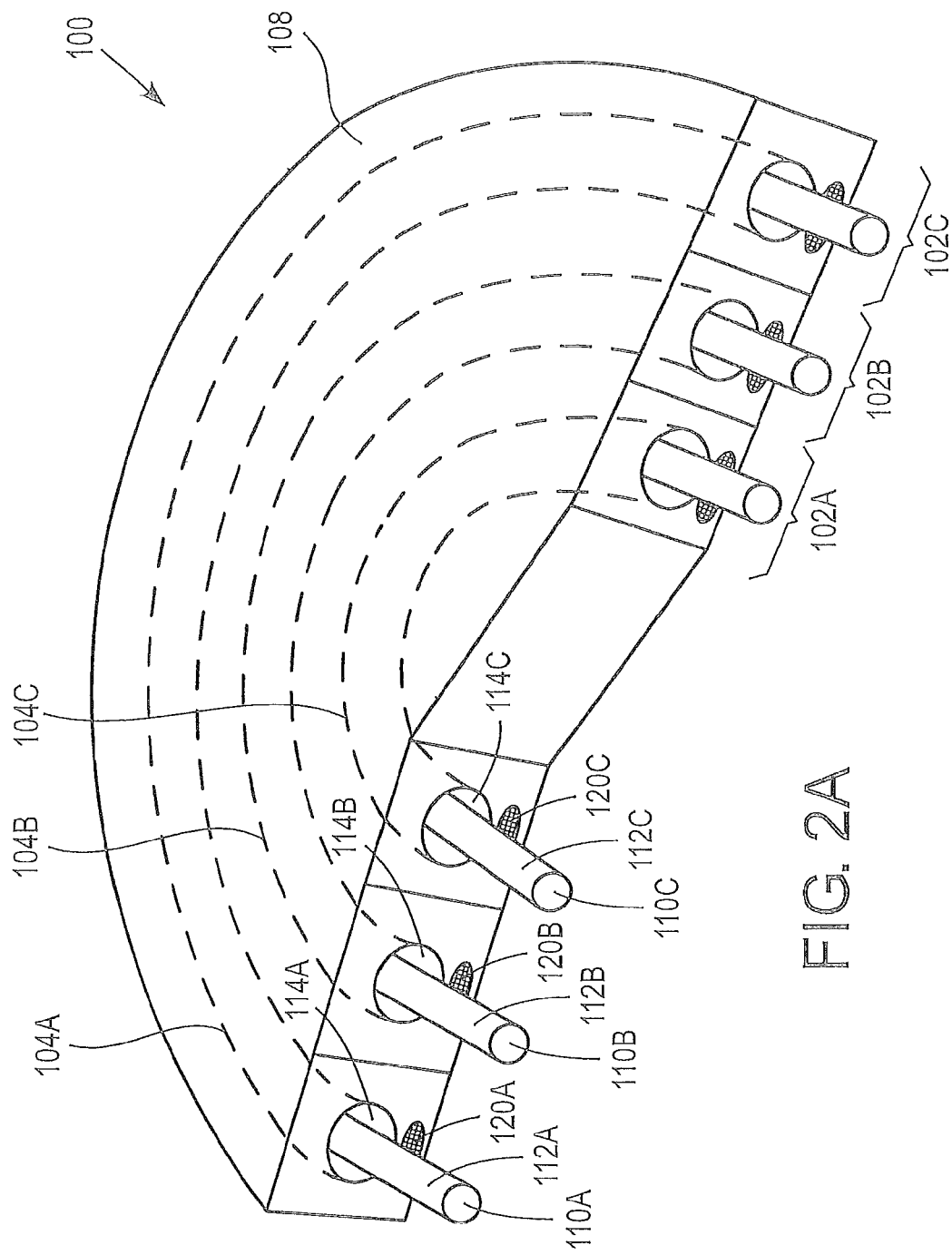
Figure 2B:
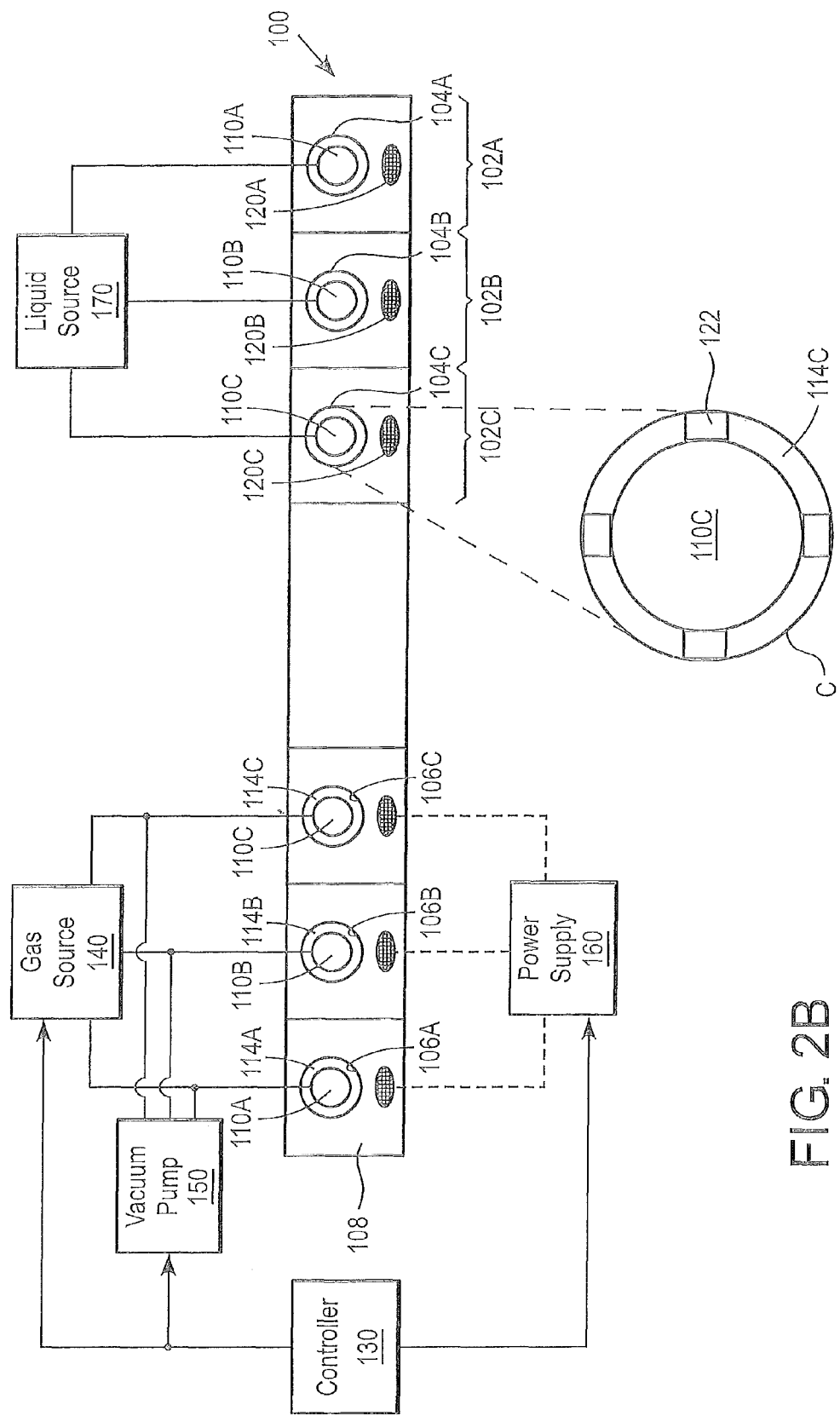
Figure 2C:
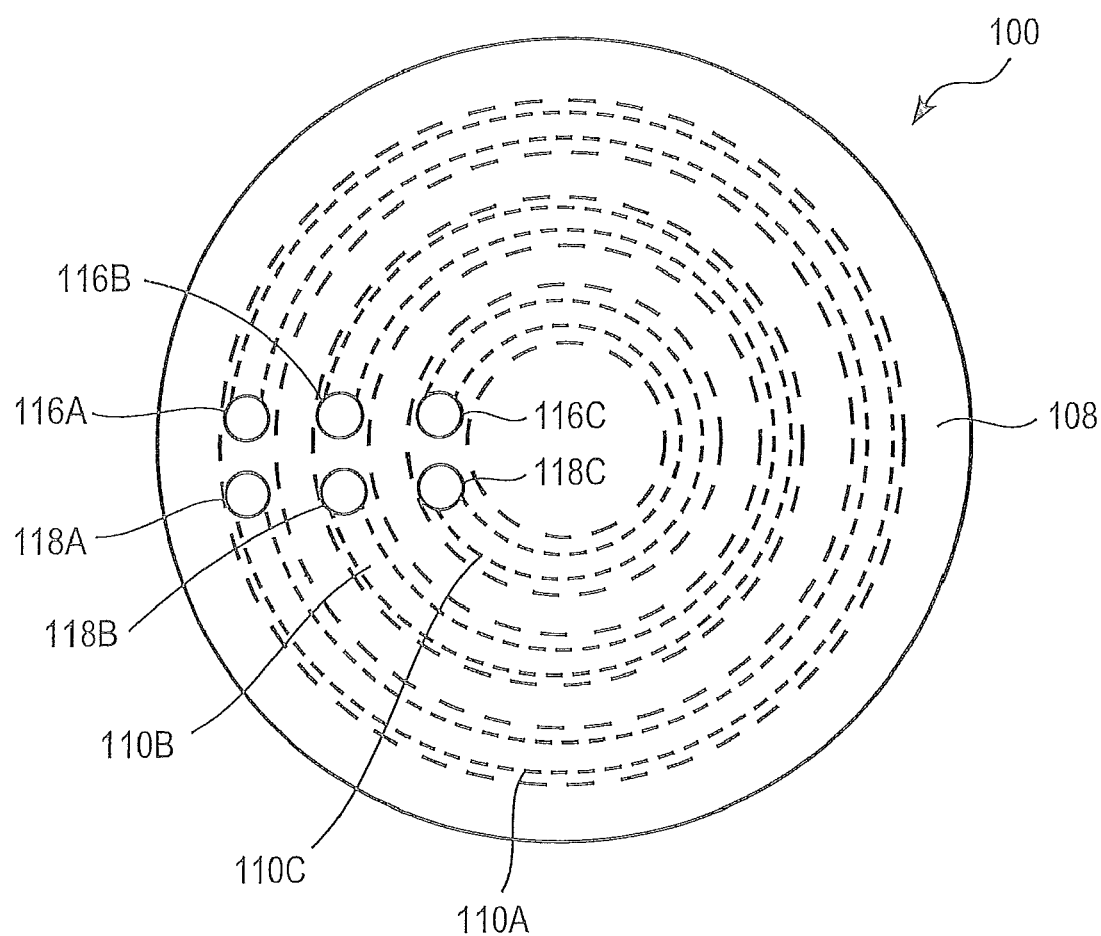
Figure 2D:
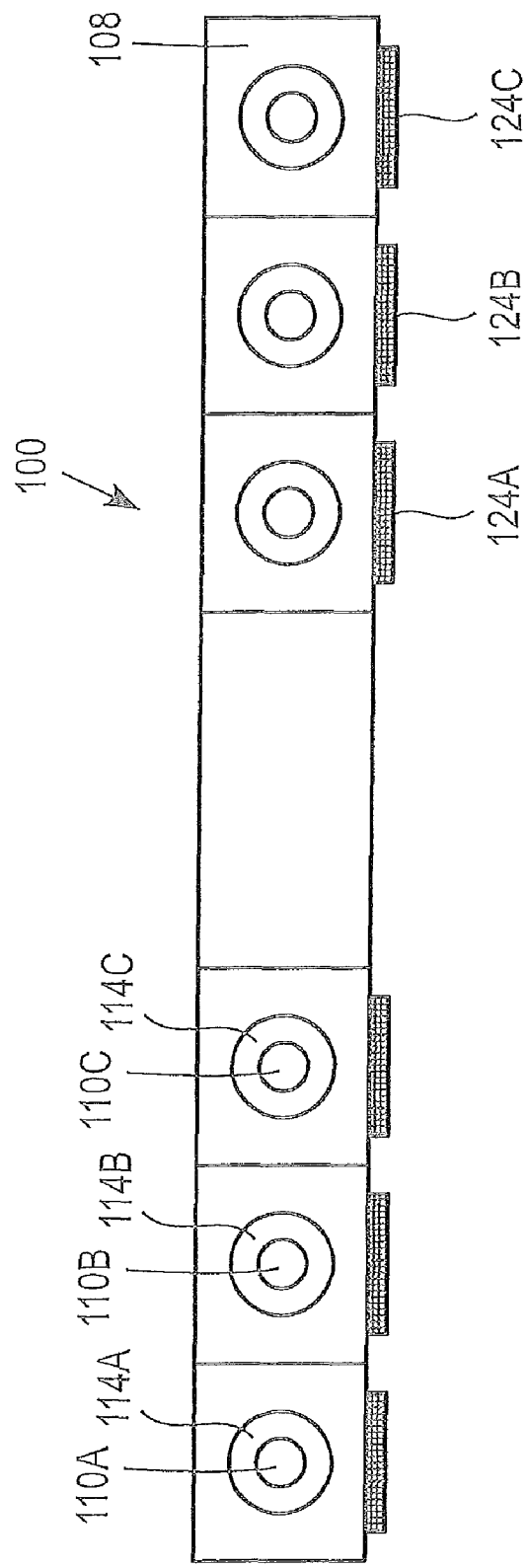

FIGS. 2A-2B illustrate an embodiment of a temperature control module 100 with heating/cooling zones 102A, 102B, 102C which are heated or cooled to provide a uniform temperature of a plasma exposed component such as a wafer support 30 or a showerhead electrode assembly 10. FIG. 2A illustrates a three-dimensional perspective broken view of temperature control module 100. FIG. 2B illustrates a cross-sectional view of temperature control module 100. FIG. 2C illustrates of top view of temperature control module 100. FIGS. 2D-2F illustrate cross-sectional views of additional embodiments of temperature control module 100.

As illustrated in FIGS. 2A-2B, temperature control module 100 includes a plurality of channels 104A, 104B, 104C each having circular interior surfaces 106A, 106B, 106C (illustrated in FIG. 2B) located within or embedded in a thermally conductive component 108. In one embodiment, thermally conductive component 108 is a circular plate composed of aluminum or an aluminum alloy. Tubes 110A, 110B, 110C, having circular exterior surfaces 112A, 112B, 112C, are placed in the interior of each of the channels 104A, 104B, 104C. Annular spaces 114A, 114B, 114C (illustrated in FIG. 2B) are located between the interior surfaces 106A, 106B, 106C of the channels 104A, 104B, 104C and the exterior surfaces 112A, 112B, 112C of the tubes 110A, 110B, 110C. This configuration provides a concentric tubular arrangement in which tubes 110A, 110B, 110C are adapted to flow a heat transfer liquid within channels 104A, 104B, 104C. Surrounding the tubes 110A, 110B, 110C are annular spaces 114A, 114B, 114C adapted to contain a heat transfer gas which can be pressurized to increase thermal conductance between the thermally conductive component 108 and the heat transfer liquid.

Channels 104A, 104B, 104C can be concentrically arranged relative to the center of thermally conductive component 108 to provide concentric heating/cooling zones 102A, 102B, 102C. To effect cooling, a heat transfer liquid can flow inside tubes 110A, 110B, 110C. In one embodiment, channels 104A, 104B, 104C can be three separate concentric channels. As illustrated in FIG. 2C, the heat transfer liquid enters tubes 110A, 110B, 110C via separate inlets 116A, 116B, 116C, respectively and flows in a desired pattern within thermally conductive component 108. The heat transfer liquid exits tubes 110A, 110B, 110C via separate outlets 118A, 118B, 118C, respectively. For this embodiment, the amount of heat transferred to the heat transfer liquid flowing in tubes 110A, 110B, 110C can be individually controlled via a controller which controls the temperature and/or flow rate of the liquid.

The heat transfer liquid can be any liquid having suitable thermal transfer properties for use in tubes 110A, 110B, 110C. For example, the heat transfer liquid can be water (e.g., deionized water), ethylene glycol, silicon oil, water/ethylene glycol mixtures, and the like. The cooling performance of the heat transfer liquid can be controlled by using different liquids and/or mixtures of different liquids, varying the liquid flow rate, and/or varying the initial temperature of the liquid. To effect heating, the heat transfer liquid can be heated. However, for a faster heating and cooling response time, a chilled heat transfer liquid can be circulated in the tubes 110A, 110B, 110C and heater elements 120A, 120B, 120C can be used to increase the temperature of each heating/cooling zone 102A, 102B, 102C.

As illustrated in FIGS. 2A-2B, annular spaces 114A, 114B, 114C are formed between the interior surface 106A, 106B, 106C of the channels 104A, 104B, 104C and the exterior surfaces 112A, 112B, 112C of the tubes 110A, 110B, 110C. Annular spaces 114A, 114B, 114C can hold a pressurized heat transfer gas, for example, helium, neon, argon, or nitrogen. In one embodiment, the width (i.e., radial dimension) of annular spaces 114A, 114B, 114C is between about 5 mil and about 100 mil (about 0.005 to about 0.10 inches), preferably about 50 mil (about 0.05 inch).

Support structures 122 can be placed between the exterior surfaces 112A, 112B, 112C of the tubes 110A, 110B, 110C and the interior surfaces 106A, 106B, 106C of each channel 104A, 104B, 104C (as illustrated in enlarged region C of FIG. 2B). Support structures 122 can comprise protrusions or rings with projections. For example, support structures 122 can be protrusions integral to the exterior surfaces 112A, 112B, 112C of tubes 110A, 110B, 110C or protrusions integral with the interior surfaces 106A, 106B, 106C of channels 104A, 104B, 104C. Support structures 122 prevent tubes 110A, 110B, 110C from contacting the interior surfaces 106A, 106B, 106C of channels 104A, 104B, 104C. Preferably, support structures 122 maintain substantially uniform spaces 114A, 114B, 114C between exterior surfaces 112A, 112B, 112C of tubes 110A, 110B, 110C and interior surfaces 106A, 106B, 106C of channels 104A, 104B, 104C. To minimize thermal conduction between thermally conductive component 108 and the heat transfer liquid, surface contact between the support structures 122 and the interior surfaces 106A, 106B, 106C is minimized. Support structures 122 can also be composed to a thermally insulating material such as silicon nitride or aluminum oxide.

Temperature control module 100 preferably includes independently controlled heater elements 120A, 120B, 120C in thermal contact with thermally conductive component 108. Heater elements 120A, 120B, 120C can either be in contact with an exterior surface or embedded in thermally conductive component 108 with at least one heating element 120A, 120B, 120C located in a respective heating/cooling zone. In one embodiment, heater elements 120A, 120B, 120C are resistive heating elements. If heating is desired, tubes 110A, 110B, 110C are thermally isolated by reducing gas pressure in spaces 114A, 114B, 114C. The heater elements allow precise temperature control by activating one or more of the heating elements 120A, 120B, 120C.

In an alternative embodiment, channels 104A, 104B, 104C can be portions of a single continuous channel and tubes 110A, 110B, 110C and be portions of a continuous single tube. The flow passage could have a spiral, zig-zag, or other pattern with one or more inlets and one or more outlets. For this embodiment, heater elements 120A, 120B, 120C control the temperature of each heating/cooling zone 102A, 102B, 102C.

During plasma processing, the outer surface temperature of a component incorporating the temperature control module 100 can increase by different amounts in different zones of the surface. The amount of heat removed in each zone by the heat transfer liquid flowing in tubes 110A, 110B, 110C can be controlled by individually adjusting the static gas pressure of the heat transfer gas in spaces 114A, 114B, 114C. By varying the static gas pressure within spaces 114A, 114B, 114C, the thermal conductivity can be varied over a wide range of about 60 W/m²-K to about 600 W/m²-K. For example, if the radial dimension of spaces 114A, 114B, 114C is about 10 mil (about 0.010 inch), the thermal conductivity of helium gas at a pressure of 1 Torr is about 60 W/m²-K. However, by increasing the pressure of the helium gas to about 100 Torr, the thermal conductivity increases to about 600 W/m²-K. Thus, the ability of the heat transfer liquid flowing in channels 104A, 104B, 104C to remove heat from thermally conductive component 108 can be rapidly achieved and a desired localized temperature can be maintained by quickly and selectively reducing the gas pressure in spaces 114A, 114B, 114C with selective heating if needed.

As illustrated in FIG. 2B, controller 130 is operable to selectively control cooling in heating/cooling zones 102A, 102B, 102C by varying the static pressure of the heat transfer gas selectively in annular spaces 114A, 114B, 114C from gas source 140 or to selectively evacuate annular spaces 114A, 114B, 114C to a vacuum pressure (e.g., less than 50 mTorr) with vacuum pump 150 to thermally isolate the heat transfer liquid from each heating/cooling zone 102A, 102B, 102C. Likewise, controller 130 is operable to control heating in each heating/cooling zones 102A, 102B, 102C by varying power from power supply 160 to heating elements 120A, 120B, 120C. For example, power supply 160 can be an alternating current (AC) or a direct current (DC) power supply. Thus, by supplying a heat transfer liquid (e.g. chilled deionized water) to tubes 110A, 110B, 110C from liquid source 170, controlling gas pressure in spaces 114A, 114B, 114C and adjusting heating as needed, localized temperature in each heating/cooling zone 102A, 102B, 102C can be precisely regulated.

In one embodiment, thermally conductive component 108 of temperature control module 100 can be formed by casting aluminum or an aluminum alloy with the tubes 110A, 110B, 110C and heating elements 120A, 120B, 120C arranged in the casting. Alternatively, plates of aluminum can be machined in casting halves such that channels 104A, 104B, 104C extend halfway into each plate. The tubes 110A, 110B, 110C can be located in one of the plates and the other plate can be bonded or mechanically attached with a suitable sealing arrangement to the plate to form the temperature control module 100. The bottom plate can be machined to include recesses for receiving heater elements 120A, 120B, 120C beneath the channels 104A, 104B, 104C. In another embodiment, the thermally conductive component 108 can be made of ceramic such as sintered aluminum nitride (AlN), silicon carbide (SiC) or other thermally conductive material.

In an alternative embodiment, illustrated in FIG. 2D, temperature control module 100 includes independently controlled heater elements 124A, 124B, 124C mounted to a surface of thermally conductive component 108. For example, heater elements 124A, 124B, 124C can either be mounted by brazing or bonding. Elastomeric bonding material, as described above, that accommodates thermal stresses and transfers heat, can be used to mount heater elements 124A, 124B, 124C to thermally conductive component 108. Surface mounted heater elements 124A, 124B, 124C provide the ability to cast thermally conductive component 108 as a thinner component, thus reducing its overall thermal mass.

FIGS. 2E-2F illustrate additional embodiments of temperature control module 100 in which thermally conductive component 108 can be partitioned into at least one heating/cooling zone containing more than one channel 104 and/or more than one heating element 120 or surface mounted heating element 124. In the FIG. 2E embodiment, each heating/cooling zone 102A, 102B contains a plurality of heating elements 120 and a plurality of channels 104 having concentric tubes 110 surrounded by annular spaces 114. In the FIG. 2F embodiment, each heating/cooling zone 102A, 102B contains a plurality of channels 104 having concentric tubes 110 surrounded by annular spaces 114 and surface mounted heater elements 124 mounted to a surface of thermally conductive component 108.

Figure 3B:
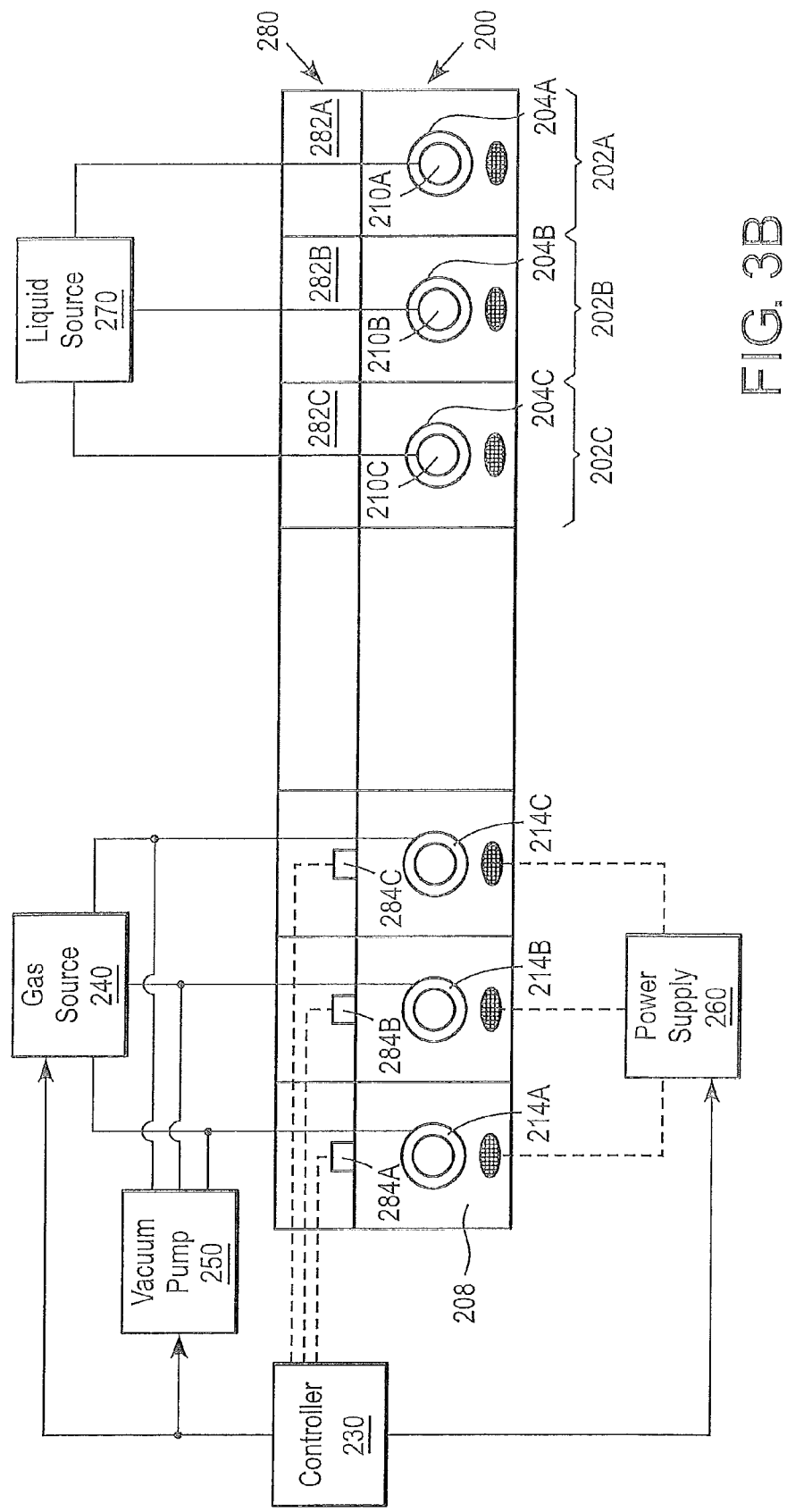

As illustrated in FIGS. 3A-3B, the thermally conductive component 208 is partitioned into multiple heating/cooling zones 202A, 202B, 202C, each zone containing respective channels 204A, 204B, 204C and heating elements 220A, 220B, 220C. In alternate embodiments (not show in FIG. 3), thermally conductive component 208 can be partitioned into more than three concentric zones, each zone containing more than one channel 204 and/or more than one heating element 220.

FIG. 3A illustrates a three-dimensional perspective view of temperature control module 200 attached to a plasma processing chamber component 280. FIG. 3B illustrates a cross-sectional broken view of temperature control module 200 attached to a plasma processing component 280. For example, plasma processing component 280 can be a thermal control plate 16 or a substrate support 30 on which wafer 32 is supported during plasma processing.

Temperature control zones across plasma processing component 280 can be defined as concentric regions 282A, 282B, 282C. During plasma processing, each of the regions 282A, 282B, 282C can experience different temperatures, adversely affecting plasma etch uniformity. As illustrated in FIGS. 3A and 3B each heating/cooling zone 202A, 202B, 202C of temperature control module 200 is in thermal contact with a respective region 282A, 282B, 282C. This configuration provides the ability to independently control the temperature of regions 282A, 282B, 282C.

Absent any mechanism to regulate temperature, the temperature difference between region 282C of plasma processing component 280 (near the center) and region 282A (near the edge) can be up to 100° C. during plasma processing. To monitor temperature, temperature sensors 284A, 284B, 284C can be located in zones 202A, 202B, 202C (FIG. 3B). For example, temperature sensors 284A, 284B, 284C embedded in component 280 can be thermocouples, fiber optic temperature sensors, or the like. To achieve a more uniform temperature profile across plasma processing component 280, region 282C can be selectively cooled by heating/cooling zone 202C and/or region 282A can be selectively heated by heat/cooling zone 202A, as described below.

Initially, heat transfer liquid (e.g., chilled deionized water) flows through tubes 210A, 210B, 210C. For example, heat transfer liquid such as chilled deionized water at about 20° C. or lower can flow through tubes 210A, 210B, 210C at a flow rate between about 1 gallon per minute to about 3 gallons per minute. For individual control, channels 204A, 204B, 204C can be three separate concentric channels. The heat transfer liquid can enter tubes 210A, 210B, 210C via separate inlets to flow in a desired pattern and exit via separate outlets as illustrated in the FIG. 2C embodiment. The cooling performance of the heat transfer liquid can be controlled by using different liquids and/or mixtures of different liquids, varying the liquid flow rate, and/or varying the temperature of the liquid introduced into tubes 210A, 210B, 210C.

To thermally isolate tubes 210A, 210B, 210C, the pressure of the heat transfer gas in spaces 214A, 214B, 214C is maintained at a vacuum pressure (e.g., less than 50 mTorr) such that the thermal conductivity across spaces 214A, 214B, 214C is less than about 50 W/m²-K. For example, spaces 214A, 214B, 214C can be maintained at a vacuum pressure by a vacuum pump 250.

Controller 230 receives input signals from temperature sensors 284A, 284B, 284C. If the temperature of any one of regions 282A, 282B, 282C is above a target temperature, controller 230 is operable to activate gas source 240 to selectively increase the static pressure of the heat transfer gas in the corresponding spaces 214A, 214B, 214C. This increase in static pressure also increases heat conduction to the heat transfer liquid flowing in tubes 210A, 210B, 210C. When the temperature of regions 282A, 282B, 282C drops below the target temperature, controller 230 causes vacuum pump 250 to selectively evacuate the corresponding spaces 214A, 214B, 214C to a vacuum pressure (e.g., less than 50 mTorr) to limit heat conduction to cooling liquid flowing in channels 204A, 204B, 204C.

For example, if temperature sensor 284A detects that region 282A of plasma processing component 280 is at a temperature greater than a target temperature, temperature controller 230 activates the cooling mechanism of heating/cooling zone 202A. Temperature controller 230 causes gas source 240 to increases the gas pressure in the corresponding space 214A from vacuum pressure (e.g., <50 mTorr) to an elevated pressure (e.g., about 100 Torr to about 200 Torr). In one embodiment, the gas pressure in space 214A is measured by a pressure sensor (e.g. universal pressure controller). Preferably, the elevated gas pressure increases the thermal conductivity across the corresponding space 214A to between about 500 W/m²-K and about 600 W/m²-K. For example, the heat transfer gas can be helium at a pressure of 100 Torr in a space having a radial dimension of about 10 mil (about 0.010 inch). By increasing the thermal conductivity across space 214A, the heat transfer liquid flowing through tube 210A transfers heat away from region 282A, thus lowering the temperature. When the temperature of region 282A drops below the target temperature, controller 230 causes vacuum pump 250 to evacuate space 214A to a vacuum pressure (e.g., less than 50 mTorr) and heater 220A is activated to supply heat to region 282A. Thus, rapid and precise temperature control can be achieved.

If the temperature of any one of regions 282A, 282B, 282C falls below the target temperature, controller 230 is operable to activate power supply 260 to selectively power one or more heater elements 220A, 220B, 220C. During heating, controller 230 causes vacuum pump 250 to selectively evacuate the corresponding spaces 214A, 214B, 214C to a vacuum pressure (e.g., less than 50 mTorr) to limit heat conduction to the heat transfer liquid flowing in channels 204A, 204B, 204C.

For example, if temperature sensor 284A detects that region 282A of plasma processing component 280 falls below a target temperature, controller 230 activates the heating mechanism of heating/cooling zone 202A. Controller 230 causes power supply 260 to supply power to heating element 220A, which heats region 202A. To minimize the amount of the heat generated by heating element 220A from transferring to the heat transfer liquid flowing through tube 210A instead of heating region 202A, controller 230 also causes vacuum pump 250 to evacuate space 214A to a vacuum pressure (e.g., less than 50 mTorr) in about 60 seconds or less. Once the temperature of region 202A is heated to the target temperature, the controller 230 terminates power to heating element 220A.

Figure 4:
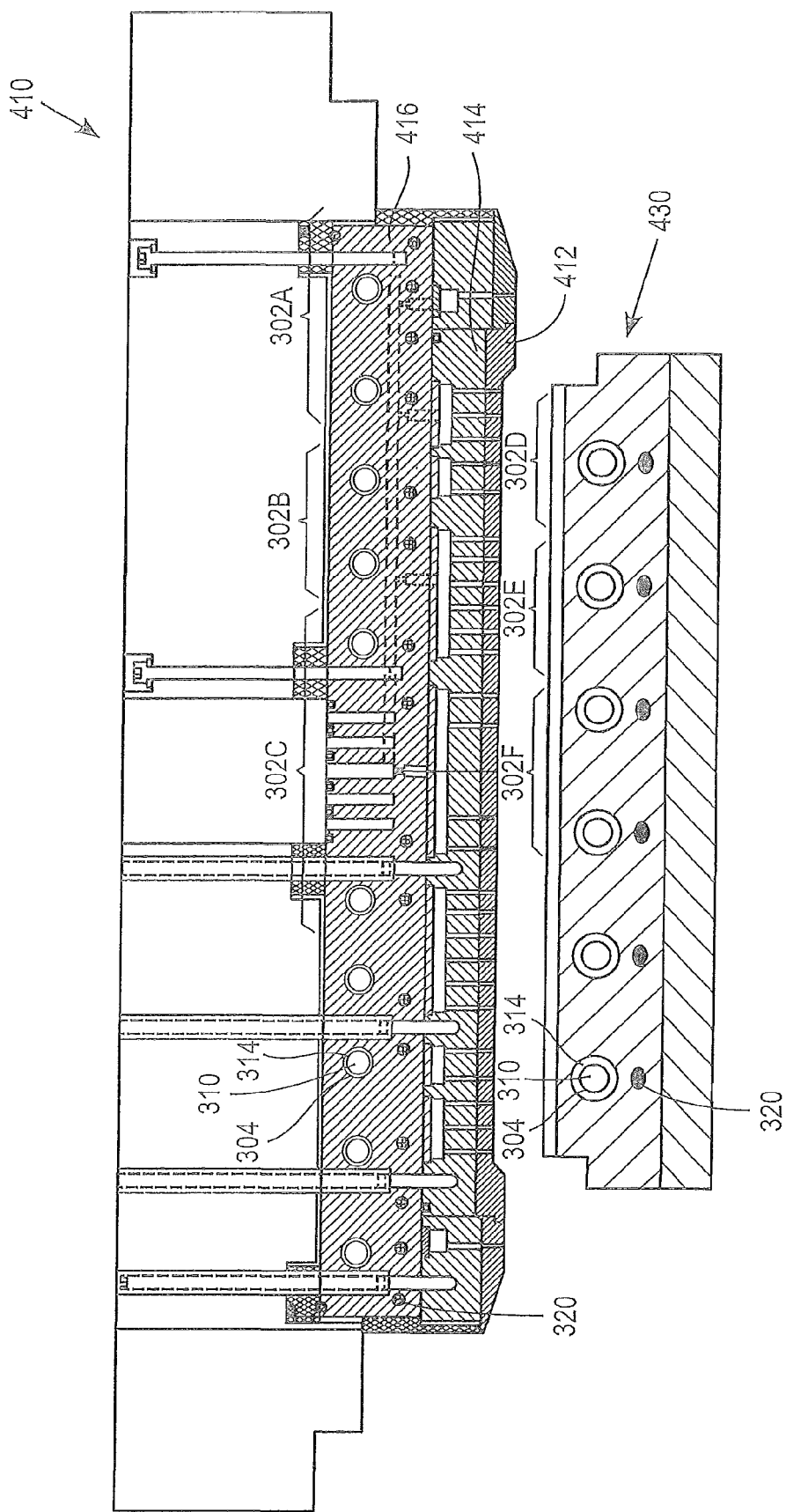
FIG. 4 is a cross-sectional view of an exemplary embodiment of a plasma processing apparatus including the thermal control module.

FIG. 4 illustrates a cross-sectional view of showerhead electrode assembly 410 and substrate support 430 including the integrated temperature control module as described above. Showerhead electrode assembly 410 includes a top electrode 412, a backing member 414 secured to the top electrode 412, and a thermal control plate 416. Thermal control plate 416 contains a plurality of heating elements 320 and channels 304 with concentric tubes 310 for the flow of chilled heat transfer liquid. Spaces 314 surround tubes 310 and are adapted to contain heat transfer gas which can be pressurized to increase thermal conductance between thermal control plate 416 and liquid flowing through the tubes. Thermal control plate 416 contains separate heating/cooling zones 302A, 302B, 302C.

Also illustrated in FIG. 4, substrate support 430 contains heating elements 320 and channels 304 with concentric tubes 310 for the flow of chilled heat transfer liquid and space 314 adapted to contain a pressurized heat transfer gas. Substrate support 430 also contains separate heating/cooling zones 302D, 302E, 302F.

EXAMPLE

Testing was performed to determine heating rates and cooling rates of thermal control plate 416, including heating elements 320 and channels 304 with concentric tubes 310, as a function of static gas pressure in space 314. Thermal control plate 416 was formed by casting an aluminum alloy with stainless steel tube 310 and resistive heating elements 320 arranged in the casting. Stainless steel tube 310 was a single continuous tube having a spiral configuration arranged within the casting. Tube 310 has a single heat transfer liquid inlet and a single outlet. Tube 310 has an outer diameter of about 0.38 inches. The diameter of channel 304 was about 0.5 inches and the radial dimension of space 314 about 0.06 inches.

Thermal control plate 416 was installed in an EXELAN® FLEX™ dielectric plasma etch system, manufactured by Lam Research Corporation, located in Fremont, Calif. During testing, water was used as a heat transfer liquid. Cooling water with an initial temperature of between about 15° C. and about 20° C. was flowed into tube 310 at a volumetric flow rate between about 1 and about 2 gallons per minute. To determine heating rate, thermal control plate 416 was heated from about 40° C. to about 200° C. by applying about 6900 Watts to heating elements 320, while the static helium pressure was varied from between about 50 mTorr to about 200 Torr. Results of the heating test are summarized in FIG. 5A. To determine cooling rate, thermal control plate 416 was initially heated to 160° C. and cooled to 60° C., while static helium pressure was varied from between about 50 mTorr to about 200 Torr while circulating water at 15° C. to 20° C. in tube 310. Results of the heating test are summarized in FIG. 5B.

Figure 5A:
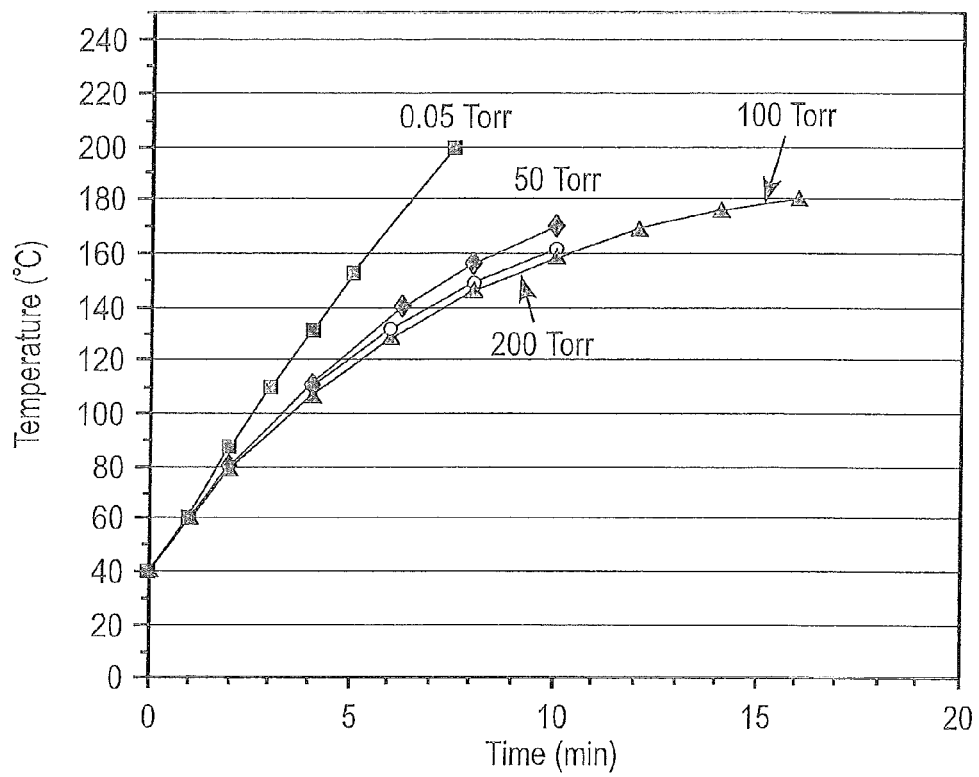
FIGS. 5A and 5B are graphs of experimental heating and cooling rates of the thermal control module.
Figure 5B:
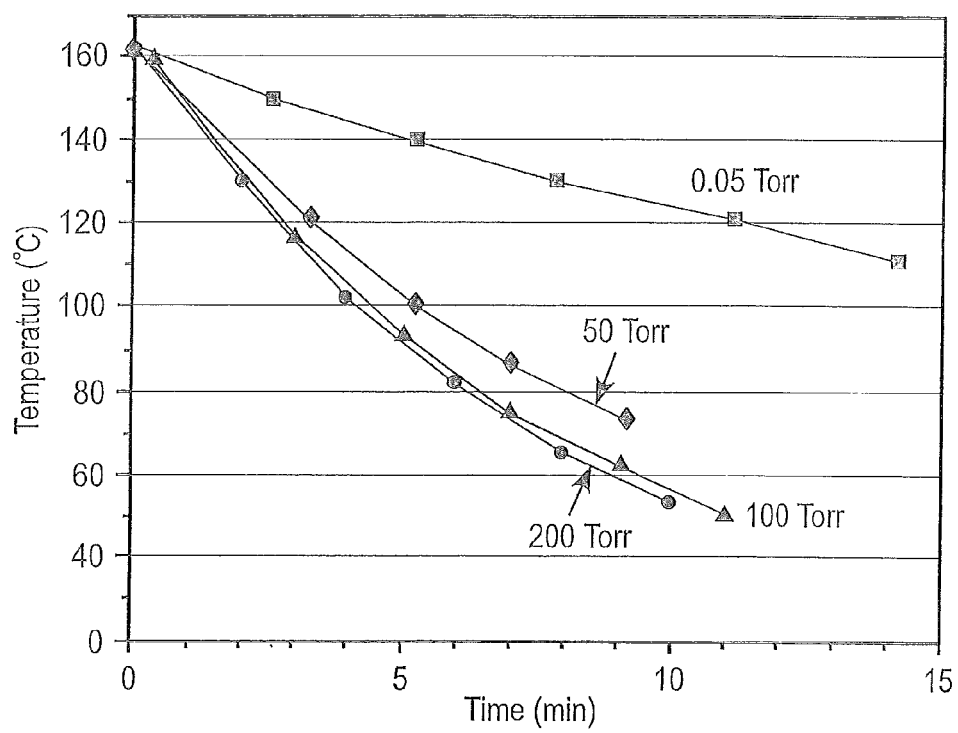

FIG. 5A illustrates that a static helium pressure of about 50 mTorr, the thermal control plate 416 could be heated from 40° C. to about 200° C. in under 8 minutes (i.e., heating rate of about 20° C./minute). As the static pressure of the helium was increased to over 50 Torr, heating to 170° C. required an excess of 10 minutes, due to the conduction of heat generated by heating elements 320 through the helium gas in space 314. FIG. 5B illustrates that with a static helium pressure of about 100 Torr to 200 Torr, thermal control plate 416 can be cooled from about 160° C. to about 50° C. in about 11 minutes (i.e., about 10° C./minute).

While the invention has been described in detail with reference to specific embodiments thereof, it will be apparent to those skilled in the art that various changes and modifications can be made, and equivalents employed, without departing from the scope of the appended claims.

What is claimed is:

1. A method of controlling a temperature of a plasma processing component having multiple regions, comprising:
supporting a semiconductor substrate in a plasma processing chamber containing a temperature control module, wherein the multiple regions of the plasma processing component are in thermal contact with heating/cooling zones of the temperature control module, the temperature control module including a thermally conductive component body, channels in the component body, each channel having an interior surface, a tube in each channel, the tube having an exterior surface, a space between the exterior surface of each tube and the interior surface of the channel, the space adapted to contain a volume of pressurized heat transfer gas, a liquid source connected to each tube and operable to flow heat transfer liquid through the tube, a controller, a gas source and a vacuum pump connected to the spaces, the gas source operable to selectively increase a static gas pressure in each space in response to the controller and the vacuum pump operable to selectively evacuate each space in response to the controller, a plurality of heating elements in thermal contact with the component body, wherein each heating/cooling zone contains one or more channels and one or more heating elements, and a power supply adapted to selectively supply power to the heating elements in response to the controller;
flowing liquid through the tubes of the temperature control module;
measuring a temperature of one or more of the multiple regions of the plasma processing component;
increasing a pressure of a heat transfer gas to an elevated pressure in at least one of the spaces when the temperature of the one or more regions is above a target temperature and decreasing the pressure of the heat transfer gas when the temperature of the one or more regions is below the target temperature; and
maintaining or decreasing the pressure of the heat transfer gas to a reduced pressure in one or more of the spaces and applying power to one or more of the heating elements when the temperature of the one or more regions is below the target temperature and terminating power to the one or more heating elements when the temperature of the one or more regions rises above the target temperature;
wherein a temperature difference across the multiple regions is less than 50° C.

2. The method of claim 1, wherein increasing the pressure of the heat transfer gas results in a thermal conductivity across the space of between about 500 W/m$^2$K and about 600 W/m$^2$K; decreasing the pressure of the heat transfer gas results in a thermal conductivity across the cylindrical space of less than about 60 W/m$^2$K; and the heat transfer gas is helium, neon, argon or nitrogen.

3. The method of claim 1, wherein the heat transfer gas is helium, the reduced pressure is about 1 Torr or less and the elevated pressure is between about 100 Torr and 200 Torr.

4. The method of claim 1, wherein the temperature difference is less than 25° C. or less than 10° C.

5. The method of claim 1, wherein the temperature difference is less than 5° C.

6. The method of claim 1, further comprising:
introducing a process gas into the chamber with a showerhead electrode assembly attached to the temperature control module;
generating a plasma from the process gas in a region of the chamber between the showerhead electrode assembly and the substrate; and
processing the substrate with the plasma.

7. The method of claim 6, further comprising:
supporting the substrate on a substrate support attached to the temperature control module, wherein the processing comprises plasma etching.

8. The method of claim 1, wherein the plurality of heating elements are contained within the thermally conductive component body.

9. The method of claim 1, wherein the plurality of heating elements are bonded or brazed to a surface of the thermally conductive component body.

10. The method of claim 1, wherein the thermally conductive component body is a circular plate composed of aluminum, aluminum alloy, aluminum nitride or silicon carbide.

11. The method of claim 10, wherein the channels and heating elements are at different radial distances relative to a center of the circular plate.

12. The method of claim 10, wherein the heating zones are concentrically arranged relative to a center of the circular plate.

13. The method of claim 1, wherein support structures are located between the interior surfaces of the channels and the exterior surfaces of the tubes, the support structures adapted to maintain annular spaces of substantially uniform dimensions between the exterior surfaces of the tubes and opposed interior surfaces of the channels.

14. The method of claim 13, wherein the support structures comprise protrusions on the tubes or interior surfaces or rings with projections.

15. The method of claim 1, wherein the spaces have a radial dimension of between about 5 mil and about 100 mil.

16. The method of claim 1, wherein the thermally conductive component body is attached to a showerhead electrode and contains one or more gas passages for the flow of a process gas to the semiconductor processing chamber.

17. The method of claim 1, wherein the thermally conductive component body is attached to a substrate support.

* * * * *